(12) United States Patent
Puchner et al.

(10) Patent No.: US 6,613,651 B1
(45) Date of Patent: Sep. 2, 2003

(54) INTEGRATED CIRCUIT ISOLATION SYSTEM

(75) Inventors: Helmut Puchner, Santa Clara, CA (US); Sheldon Aronowitz, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 19 days.

(21) Appl. No.: 09/654,689

(22) Filed: Sep. 5, 2000

(51) Int. Cl.[7] ............................................. H01L 21/76
(52) U.S. Cl. ..................................... 438/446; 438/225
(58) Field of Search ................................ 438/424, 425, 438/430–32, 443–446, 225; 257/506

(56) References Cited

U.S. PATENT DOCUMENTS

| | | | | |
|---|---|---|---|---|
| 4,471,525 A | | 9/1984 | Sasaki ........................ 438/431 |
| 4,561,172 A | * | 12/1985 | Slawinski et al. .......... 438/297 |
| 5,229,318 A | * | 7/1993 | Straboni et al. ............ 438/446 |
| 5,399,520 A | * | 3/1995 | Jang ........................... 438/445 |
| 5,424,240 A | * | 6/1995 | Han ............................ 438/446 |
| 5,512,509 A | * | 4/1996 | Han ............................ 438/446 |
| 5,665,635 A | * | 9/1997 | Kwon et al. ................ 438/427 |
| 5,681,776 A | * | 10/1997 | Herbert et al. ............. 438/442 |
| 5,824,594 A | * | 10/1998 | Kim et al. ................... 438/446 |
| 5,963,820 A | * | 10/1999 | Jeng ............................ 438/446 |
| 6,114,218 A | * | 9/2000 | Jeng ............................ 438/427 |

FOREIGN PATENT DOCUMENTS

| | | | | |
|---|---|---|---|---|
| JP | 62-014439 | * | 1/1987 | ........... H01L/21/76 |
| JP | 01-282839 | * | 11/1989 | ........... H01L/21/94 |

* cited by examiner

Primary Examiner—Olik Chaudhuri
Assistant Examiner—Anh Duy Mai
(74) Attorney, Agent, or Firm—Luedeka, Neely & Graham, P.C.

(57) ABSTRACT

A method of forming a narrow isolation structure in a semiconducting substrate. The isolation structure is a trench that has a bottom and sidewalls, and that is to be filled with an isolating material. The isolating material has desired electrical properties and desired chemical properties, and is substantially reactively grown from the semiconducting substrate. A precursor material layer is formed on the bottom of the trench and on the sidewalls of the trench. The precursor material layer has electrical properties and chemical properties that are substantially similar to the desired electrical properties and the desired chemical properties of the isolating material. A substantial portion of the precursor material layer is removed from the bottom of the trench to expose the semiconducting substrate at the bottom of the trench, while leaving a substantial portion of the precursor material layer on the sidewalls of the trench. The isolating material is reactively grown in the trench, where the isolating material preferentially grows from the exposed semiconducting substrate at the bottom of the trench at a first rate. The precursor material layer at least partially inhibits formation of the isolating material from the semiconducting substrate at the sidewalls of the trench. The isolating material forms from the sidewalls of the trench at a second rate, where the first rate is substantially higher than the second rate. Thus, by forming a precursor layer that inhibits formation of the isolation material at the sidewalls of the trench, the isolation material preferentially grows from the bottom of the trench rather than expanding sideways from the sidewalls of the trench, which tends to widen the isolation structure. Because the precursor layer has properties that are substantially similar to those that are desired in the isolation material, the precursor layer remains at the sidewalls of the trench near the edge of the isolation structure. Therefore, the isolation structure functions as desired, but is narrower than it otherwise would be, if the precursor layer had not been formed.

12 Claims, 4 Drawing Sheets

INTEGRATED CIRCUIT ISOLATION SYSTEM

FIELD

This invention relates to the field of integrated circuit processing. More particularly the invention relates to forming isolation structures between monolithic semiconductor devices.

BACKGROUND

There is continual pressure for integrated circuits to be increasingly faster and increasingly more powerful. Both of these objectives tend to be influenced by the size of the integrated circuits. By fabricating smaller integrated circuits, electrical pathways are shorter and more devices can be formed within a given space, which tends to result in a faster, more powerful integrated circuit.

It is evident that, in order to make the integrated circuit smaller, the structures that comprise the integrated circuit must themselves be made commensurately smaller. This reduction in the size of the structures of the integrated circuit can take one or more of several different forms. For example, the structures can either be scaled down to a smaller size, or the structures can be redesigned to a new form that takes less space. Typically, a combination of these and other methods of size reduction are used to accomplish the overall objective of reducing the size of the integrated circuit.

One structure that is commonly used in integrated circuits is an isolation structure. The isolation structure is typically formed between adjacent monolithic semiconductor devices, such as between the NMOS and PMOS devices of a complementary metal oxide semiconductor device. Of course, isolation structures are used in the fabrication of other types of monolithic semiconductor devices as well.

One primary design criteria in the formation of an isolation structure is that the structure is to provide electrical isolation between the adjacent monolithic semiconductor devices that it separates. In order to do this, the isolation structure is preferably formed of a material that is nonconducting, so that electrical carriers cannot easily penetrate through the isolation structure. Further, the isolation structure preferably extends to a depth that is sufficient to substantially prevent electrical carriers from traveling under the isolation structure and creating an electrical pathway between the adjacent monolithic semiconductor devices that inhibits proper operation of the integrated circuit.

Because the monolithic semiconductor material in which the devices are formed is typically unsuitable for use as an isolation structure without some type of additional processing, the isolation structure is typically formed by removing a portion of the semiconductor material, and then replacing the semiconductor material that is removed with an insulating material.

Unfortunately, as the size of the devices and the structures on the integrated circuit are reduced, it is increasingly difficult to create adequate isolation structures. For example, as the width of the isolation structure is reduced, it is more difficult to fabricate an isolation structure that extends to a depth that is sufficient to adequately isolate the adjacent active devices. This is because the desired narrow width of the isolation structure makes it difficult to create a deep isolation structure that is filled with the insulating material.

What is needed, therefore, is a system for forming an isolation structure that is relatively narrow and yet extends to a sufficient depth so as to adequately isolate adjacent monolithic semiconductor devices.

SUMMARY

The above and other needs are met by a method of forming a narrow isolation structure in a semiconducting substrate. The isolation structure is a trench that has a bottom and sidewalls, and that is to be filled with an isolating material. The isolating material has desired electrical properties and desired chemical properties, and is substantially reactively grown from the semiconducting substrate.

A precursor material layer is formed on the bottom of the trench and on the sidewalls of the trench. The precursor material layer has electrical properties and chemical properties that are substantially similar to the desired electrical properties and the desired chemical properties of the isolating material. A substantial portion of the precursor material layer is removed from the bottom of the trench to expose the semiconducting substrate at the bottom of the trench, while leaving a substantial portion of the precursor material layer on the sidewalls of the trench.

The isolating material is reactively grown in the trench, where the isolating material preferentially grows from the exposed semiconducting substrate at the bottom of the trench at a first rate. The precursor material layer at least partially inhibits formation of the isolating material from the semiconducting substrate at the sidewalls of the trench. The isolating material forms from the sidewalls of the trench at a second rate, where the first rate is substantially higher than the second rate.

Thus, by forming a precursor layer that inhibits formation of the isolation material at the sidewalls of the trench, the isolation material preferentially grows from the bottom of the trench rather than expanding sideways from the sidewalls of the trench, which tends to widen the isolation structure. Because the precursor layer has properties that are substantially similar to those that are desired in the isolation material, the precursor layer remains at the sidewalls of the trench near the edge of the isolation structure. Therefore, the isolation structure functions as desired, but is narrower than it otherwise would be, if the precursor layer had not been formed.

In various preferred embodiments of the invention, the step of forming the precursor material layer is accomplished by oxidizing the semiconducting substrate on the bottom of the trench and on the sidewalls of the trench to form an oxide layer on the semiconducting substrate. The oxide layer on the semiconducting substrate is exposed to an agent that causes the oxide layer on the semiconducting substrate to at least partially inhibit formation of the isolating material from the semiconducting substrate.

In a most preferred embodiment, the step of oxidizing the semiconducting substrate on the bottom of the trench and on the sidewalls of the trench is accomplished by forming an oxide layer with a thickness of between about thirty angstroms and about five hundred angstroms, and most preferably about fifty angstroms. Further, the step of exposing the oxide layer on the semiconducting substrate to an agent is preferably accomplished by exposing the oxide layer to a plasma source of the agent, to incorporate a quantity of the agent into the oxide layer. Most preferably, the agent is nitrogen and the plasma source is a nitrogen plasma source.

The step of removing a substantial portion of the precursor material layer from the bottom of the trench preferably includes depositing a masking layer on top of the precursor material layer. The masking layer is removed from the precursor material layer at the bottom of the trench, and the precursor material layer that is exposed by removing the masking layer at the bottom of the trench is etched. In a most preferred embodiment the masking layer is amorphous silicon and the semiconducting substrate is substantially monocrystalline silicon.

BRIEF DESCRIPTION OF THE DRAWINGS

Further advantages of the invention are apparent by reference to the detailed description when considered in conjunction with the following figures, which are not to scale so as to more clearly show the details, wherein like reference numbers refer to like elements within the several views, and wherein.

DETAILED DESCRIPTION

Figure 1:
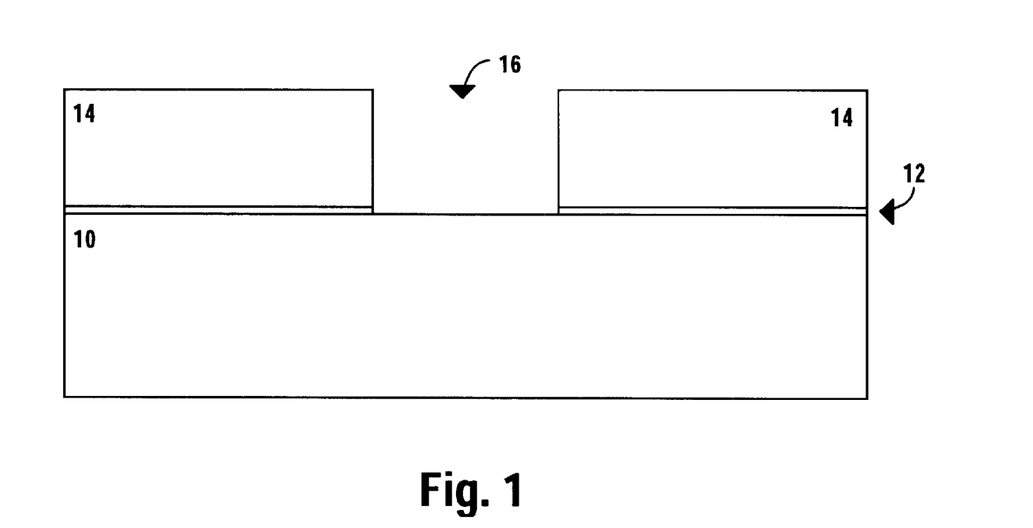
FIG. 1 is a cross sectional view of a portion of a semiconducting substrate where a masking layer for an isolation structure has been formed.

Referring now to FIG. 1, there is depicted a semiconductor substrate 10 in which monolithic integrated devices are to be formed. As described herein, the specific example used in the various embodiments is that of a silicon substrate 10, such as a monocrystalline substrate 10. However, it is appreciated that this is by way of example only, and that in the actual implementation of the invention, substrates of other materials can be used. Further, although the invention has particular applicability to semiconducting substrates, there are also substrates of other materials in which the application of the invention is beneficial.

One purpose of the method described below is to form an isolation structure between the monolithic integrated devices that are to be formed by subsequent processes. The primary purpose of the isolation structure is to electrically isolate the integrated devices one from the other. In order to accomplish this purpose, the isolation structure has certain desired electrical properties. For example, to provide the electrical isolation between adjacent integrated devices, the isolation structure is preferably nonconductive. Further, because the isolation structure is formed at a point relatively early in the overall process of forming the integrated circuits, the isolation structure preferably has certain desired chemical properties. The material for the isolation structure is selected based upon these desired chemical properties, so that the isolation structure is neither damaged by nor causes damage to the other devices or structures that are subsequently formed, or the processes by which such subsequent devices and structures are formed. The specific desired electrical properties and the specific desired chemical properties are thus determined by the specific subsequent processing and device formulation that is to occur.

Substrate 10, as depicted in FIG. 1, has received some degree of prior processing. A layer of silicon dioxide 12 has been deposited, as well as a layer of silicon nitride 14. These layers 12 and 14 are formed according to one or more of a number of different processes, such as thermal growth, physical vapor deposition, and chemical vapor deposition. The silicon nitride layer 14 and the silicon oxide layer 12 form a void or masking area 16. The void 16 may be formed according to one or more of a number of different processes, such as by overlaying the silicon nitride layer 14 with a layer of photoresist, masking, exposing, and developing the photoresist, and then either wet or dry etching the silicon nitride layer 14 and the silicon oxide layer 12 in one or more etching process steps. Preferably, at the end of the process by which the void 16 is created, such as exemplified above, any residual material such as photoresist has been removed from the substrate 10 and the layers 12 and 14, and substantially all of the silicon nitride 14 and silicon oxide 12 has been removed from the substrate 10 in the area of the void 16.

Figure 2:
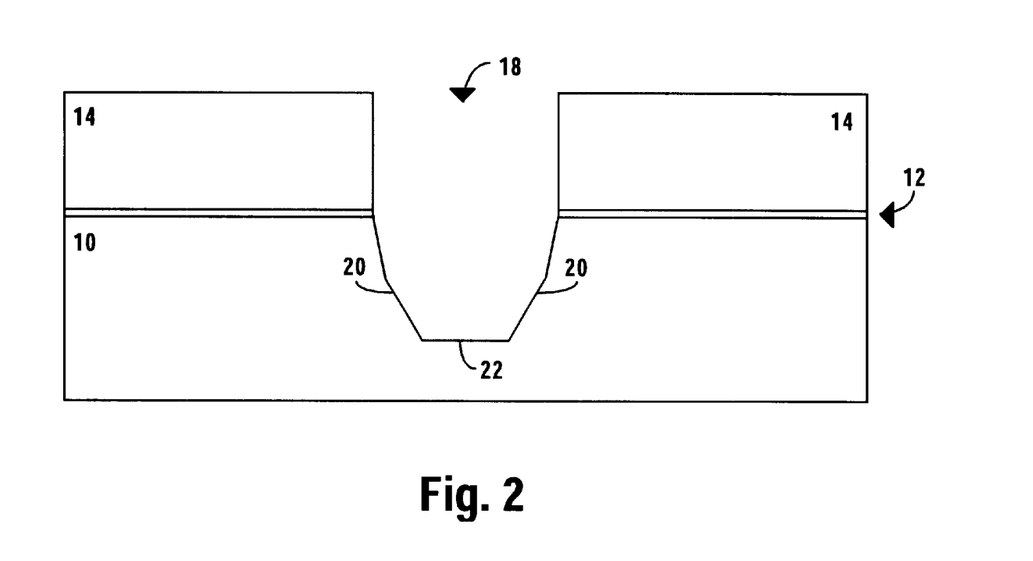
FIG. 2 is a cross sectional view of a portion of a semiconducting substrate where a trench for the isolation structure has been formed.

As depicted in FIG. 2, the void 16 (not labeled) has been used to provide access to the substrate 10 for an etchant, which created a trench 18. The trench 18 has sidewalls 20 and a bottom 22. The trench 18 may be formed according to one or more of a number of different processes, such as by wet etching with an etchant that preferentially etches the material of the substrate 10, which in this example is silicon, and etches the material of the topmost layer 14, which in this example is silicon nitride, at a reduced rate. In alternate embodiments, the trench 18 is formed by reactive ion plasma etching or a highly directional accelerated ion etch, which is substantially a highly anisotropic etch.

The width and depth to which the trench 18 is etched is selected based upon the specific requirements of the monolithic semiconductor devices that are to be formed on either side of the trench 18, at later stages of the process. Therefore, there is no specific width or depth that is specified in the present example. Because of the unique aspects of the process described below, by which the isolation structure is created, the trench 18 is preferably etched to a size that is narrower than the desired width of the isolation structure by a relatively smaller degree, and shallower than the desired depth of the isolation structure by a relatively larger degree. In other words, at the completion of the process as described below, the isolation structure is somewhat wider than the trench 18, but substantially deeper than the trench 18. Thus, the process tends to deepen the isolation structure within the trench 18 much more than it widens the isolation structure within the trench 18.

Because of this unique ability of the process to deepen the isolation structure more than it widens the isolation structure, a relatively narrower, deeper isolation structure is produced by the process. Thus, the present process according to a preferred embodiment of a method of the invention tends to produce a narrower, deeper isolation structure than other isolation structure fabrication processes. For example, according to the present process, if it is desired to produce an isolation structure having a width of between about 0.2 microns and about 0.6 microns, with a depth of between about 0.2 microns and about 0.8 microns, then the trench 18 is preferably etched to a width at the top of between about 0.18 microns and about 0.58 microns and a depth of between about 0.1 microns and about 0.2 microns, as measured from the top surface of the silicon substrate 10 (not the top surface of either the silicon oxide layer 12 or the silicon nitride layer 14) to the bottom 22 of the trench 18.

Figure 3:
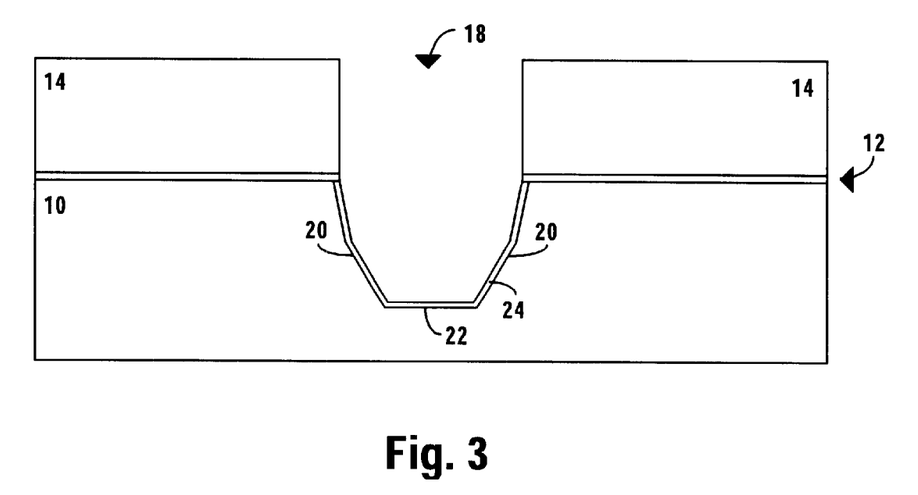
FIG. 3 is a cross sectional view of a portion of a semiconducting substrate where a precursor layer for the isolation structure has been formed.

A layer of precursor material 24 is formed on the sidewalls 20 and the bottom 22 of the trench 18, as depicted in FIG. 3. Depending upon the constitution of the precursor material layer 24, it is formed by one or more of a number of different processes. For example, if the substrate 10 is silicon, and the precursor material layer 24 is silicon oxide, then the precursor material layer 24 may be formed by one or more of the processes that include thermal oxide growth, chemical vapor deposition, or physical vapor deposition. To continue the example, in such an embodiment the precursor material layer 24 is preferably formed to a thickness of between about thirty angstroms and about five hundred angstroms, and most preferably about fifty angstroms. If the substrate 10 is formed of some other material, or if the precursor material layer 24 is to be formed of some other material, then a different deposition process may be preferred, based upon the specific formulation of the precursor material layer 24.

The precursor material layer 24 is preferably selected to have chemical properties and electrical properties that are substantially similar to the desired chemical properties and the desired electrical properties of the resulting isolation structure to be formed, as explained above. The reason for this is that the precursor material layer 24 is preferably not removed from the final isolation structure, and thus remains as a part of the isolation structure. Therefore, it is preferred that the precursor material layer 24 have chemical properties and electrical properties that are substantially similar to the desired chemical properties and the desired electrical properties of the isolation structure, so that the precursor material layer 24 does not significantly detract from the desired operation and function of the isolation structure.

The precursor material layer 24 preferably has certain properties that enable it to inhibit, at least in part, formation of the material used to form the isolation structure. Thus, on surfaces on which the precursor material layer 24 resides, the formation of the material for the isolation structure is selectively inhibited, as described in more detail below. Preferably, this unique property of the precursor material layer 24 does not in any substantial way interfere with the proper function of the resultant isolation structure. In other words, this property of the precursor material layer 24 does not cause either the electrical properties or the chemical properties of the precursor material layer 24 to substantially differ from the desired chemical properties and the desired electrical properties of the isolation structure.

This ability of the precursor material layer 24 to inhibit the formation of the material of the isolation structure may be either innately present in the precursor material layer 24 as it is formed within the trench 18, or it may arise as the result of subsequent processing to which the precursor material layer 24 is exposed after the point in time that it has been deposited in the trench 18. For example, in a preferred embodiment of the method according to the present invention, and to continue the example introduced above, the silicon oxide of the precursor material layer 24 is exposed to a nitrogen plasma source, which tends to cause the precursor material layer 24 to absorb an amount of nitrogen in a nitridation process. The nitridation process converts the silicon oxide material of the precursor material layer 24 to a nitridized silicon oxide barrier layer.

In a most preferred embodiment, the precursor material layer 24 is not directly exposed to the nitrogen plasma, rather the nitrogen plasma is remote from the substrate 10 and the precursor material layer 24 is exposed to the nitrogen ions via a downstream process. This type of process may be accomplished in a chamber such as a DPS reactor manufactured by Applied Materials of Santa Clara, Calif. The process is preferably accomplished at a pressure of between about 0.001 Torr and about 1.0 Torr, and most preferably about 0.1 Torr, with an ion density of between about three atomic percent and about thirty atomic percent, and most preferably about twenty atomic percent. The process is preferably conducted for a period of time of between about two seconds and about ten minutes, and most preferably about thirty seconds. The radio frequency plasma power is preferably set between about two hundred watts and about two thousand watts, and is most preferably set at about one thousand watts. The substrate 10 is biased to provide the preferential acceleration of the ions with a bias of between about zero watts and about fifty watts, and most preferably about ten watts. The temperature at which the nitridation is carried out should stay at or below about 250 centigrade so that neither the apparatus nor the integrated circuits are damaged during processing.

As described in more detail below, the nitridation of the silicon oxide precursor material layer 24 tends to inhibit formation of the material of the resultant isolation structure, which in the preferred embodiment is also silicon oxide. However, the nitridation of the silicon oxide precursor material layer 24 does not cause the electrical properties and the chemical properties of the precursor material layer 24 to be substantially different than the desired chemical properties and the desired electrical properties of the silicon oxide of the isolation structure. In other words, even though the nitridation of the silicon oxide precursor material layer 24 purposefully changes at least one chemical property of the silicon oxide precursor material layer 24, in that it tends to inhibit the growth of additional silicon oxide from the silicon surface on which it resides, this does not cause a change to any of the chemical properties or any of the electrical properties that are desired in the silicon oxide material used to form the isolation structure, and thus does not cause a degradation in the function of the isolation structure, or adversely effect subsequently performed processes or subsequently formed structures.

One desired outcome of the method according to a preferred embodiment of the present invention is to selectively inhibit growth of the isolation structure in the horizontal direction, thus making it a relatively narrow structure, while preferentially growing the isolation structure in the vertical direction, thus making it a relatively deep structure. Because the precursor material layer 24 selectively inhibits growth of the isolation structure, as described above, the precursor material layer 24 is preferably substantially removed from at least a portion of the bottom 22 of the trench 18. Similarly, the precursor material layer 24 is preferably substantially retained across the majority of the sidewalls 20 of the trench 18. In this manner, the semiconducting substrate 10 is exposed at the bottom 22 of the trench 18, but remains covered by the precursor material layer 24 at the sidewalls 20 of the trench 18.

Although the precursor material layer 24 could be selectively removed from the bottom 22 of the trench 18 in some direct manner, such as a highly directional accelerated ion etch, in the preferred embodiment, the precursor material layer 24 is masked in some manner, so that the precursor material layer 24 that overlies the semiconducting substrate 10 at the sidewalls 20 of the trench 18 is protected from the etch process, and the precursor material layer 24 that overlies the semiconducting substrate 10 at the bottom 22 of the trench 18 is exposed to the etch process.

Figure 4:
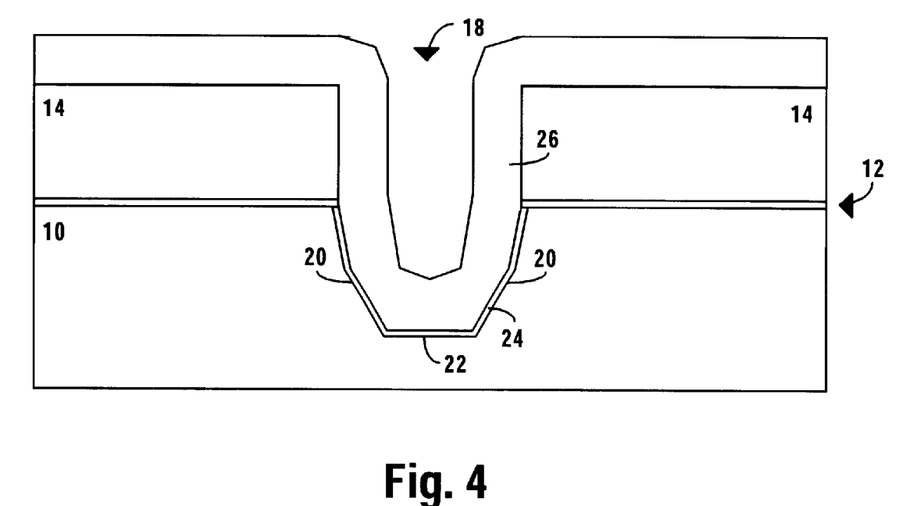
FIG. 4 is a cross sectional view of a portion of a semiconducting substrate where a masking layer for the precursor layer for the isolation structure has been formed.

In a preferred method of masking the precursor material layer 24, a masking layer 26 of amorphous silicon is deposited on the silicon nitride layer 14 and inside the trench 18 on the nitridized silicon oxide precursor material layer 24, as depicted in FIG. 4. While the masking layer 26 may be formed according to one or more of a number of different processes, such as physical vapor deposition, in the preferred embodiment the masking layer 26 of amorphous silicon is formed by chemical vapor deposition, so as to create a more conformal layer, as depicted in FIG. 4. However, other methods of forming a relatively conformal masking layer 26 may also be employed.

In the preferred embodiment, the masking layer 26 of amorphous silicon is deposited to a thickness of between about one hundred angstroms and about one thousand angstroms, and most preferably about four hundred angstroms. This thickness of the masking layer 26 is selected at least in part to provide adequate protection for the precursor material layer 24 against the preferred etchants for the masking layer 26 and the precursor material layer 24, as explained in more detail below. If different etchants are selected, then other thicknesses and materials for the formation of the masking layer 26 may be preferred. In the preferred embodiment, the thickness of the masking layer 26 is also selected based at least somewhat in part upon its use in the formation of the material of the isolation structure, as described in more detail below.

The masking layer 26 is etched to reveal the precursor material layer 24 at the bottom 22 of the trench 18. In the preferred embodiment, the trench 18 is too narrow to effectively mask the masking layer 26 with a photoresist and wet etch the masking layer 26 to expose the precursor material layer 24. Further, a wet etch would tend to remove the masking layer 26 from the sidewalls 20 of the trench 18, as well as from the bottom 22 of the trench 18. Therefore, in the preferred embodiment the amorphous silicon masking layer 26 is etched with a highly direction accelerated ion etch to substantially expose the nitridized silicon oxide precursor material layer 24 at the bottom 22 of the trench 18, while allowing a substantial portion of the masking layer 26 to remain over the precursor material layer 24 at the sidewalls 20 of the trench 18.

Figure 5:
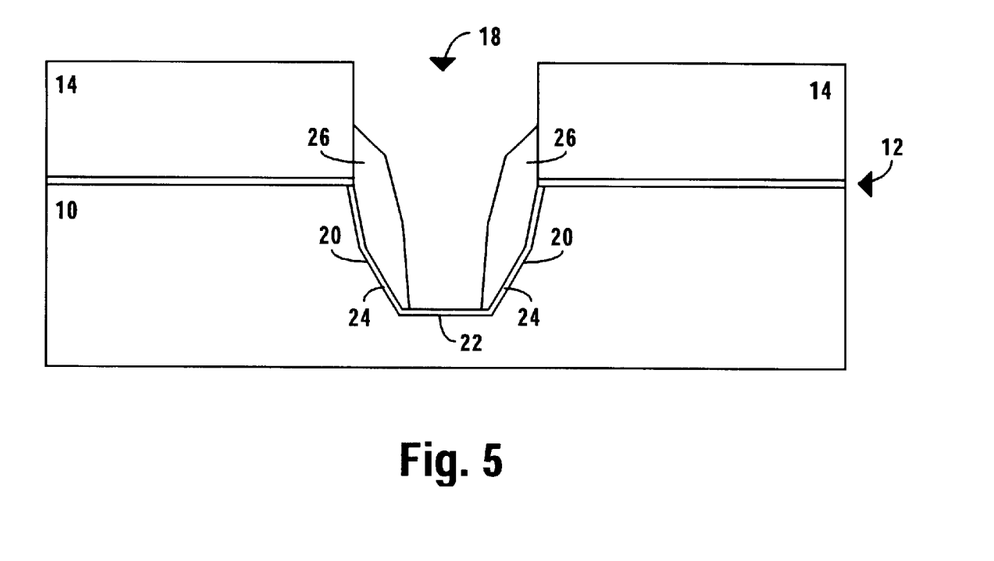
FIG. 5 is a cross sectional view of a portion of a semiconducting substrate where the masking layer for the precursor layer for the isolation structure has been etched.

This type of etch may be accomplished in a 9400SE TCP reactor, manufactured by LAM Research of Fremont, Calif. The etch is preferably accomplished at a pressure of between about zero Torr and about 0.1 Torr, and most preferably about 0.015 Torr. The ion species is preferably HBr or Cl based, and most preferably HBr. The ion flow rate is preferably between about zero cubic centimeters per minute and about three hundred cubic centimeters per minute, and most preferably about two hundred cubic centimeters per minute. The substrate 10 is biased to provide the preferential acceleration of the ions with a bias of between about zero watts and about one hundred and fifty watts, and most preferably about eighty watts.

As depicted in FIG. 5, this type of directional etch tends to preferentially remove material in a vertical plane (from a horizontal surface) while removing relatively less material in a horizontal plane (from a vertical surface). Thus, the masking material 26 is selectively etched down from the top horizontal surfaces of the masking material 26, while the vertical surfaces of the masking material 26 near the vertical sidewalls 18 of the trench 18 remain substantially intact. Thus, the result of the preferred etching process as described above is that the precursor material layer 24 remains substantially covered at the sidewalls 20 of the trench 18, and the precursor material layer 24 is substantially exposed at the bottom 22 of the trench 18.

Figure 6:
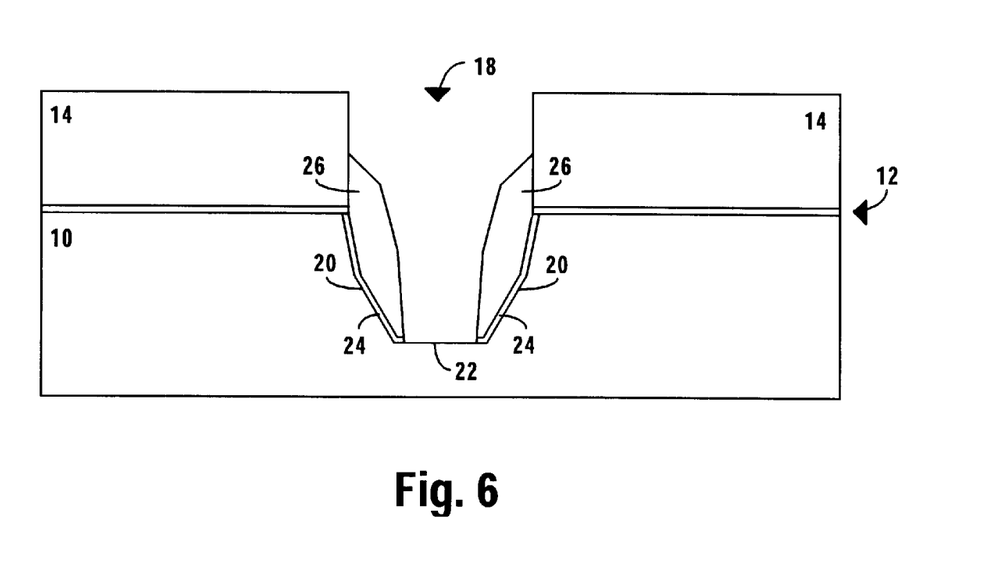
FIG. 6 is a cross sectional view of a portion of a semiconducting substrate where the precursor layer for the isolation structure has been etched.

In an alternate embodiment of the masking layer 26 etch, as described above, the etch is conducted to a point at which the precursor material layer 24 is removed from the bottom 22 of the trench 18 in the same etch process that is used to etch the masking layer 26. However, in a preferred embodiment of a method according to the invention, the precursor material layer 24 is separately etched with an etchant that selectively etches the precursor material layer 24 and not the masking layer 26 or the semiconducting substrate 10. To continue the example above, in which the masking layer 26 is amorphous silicon, the precursor material layer 24 is nitridized silicon oxide, and the semiconducting substrate 10 is silicon, the silicon oxide precursor material layer 24 is etched in a solution of hydrofluoric acid. In an alternate embodiment where the masking layer 26 is low temperature oxide, the precursor material layer 24 is preferably removed from the bottom 22 of the trench 18 during the highly directional etch when the masking layer 26 is removed from the bottom 22 of the trench 18. FIG. 6 depicts the structure after the precursor material layer 24 has been substantially removed from the bottom 22 of the trench 18.

Figure 7:
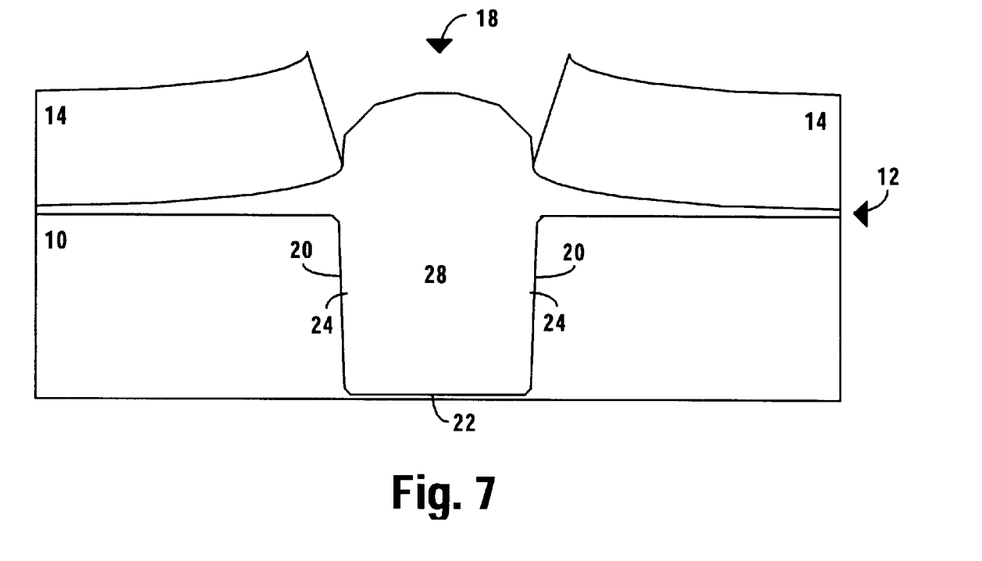
FIG. 7 is a cross sectional view of a portion of a semiconducting substrate where the isolation structure has been formed.

The material for the isolation structure 28, as depicted in FIG. 7, is formed by selectively oxidizing the material of the semiconducting substrate 10, and the material of the masking layer 26, if the material of the masking layer 26 has been specifically selected to function in that manner, as in the preferred embodiment. Thus, the specific selection of amorphous silicon as the material of the masking layer 26 becomes more desirable in this embodiment, as it does not need to be removed prior to formation of the material for the isolation structure 28. Rather, the material of the masking layer 26 is preferably used to help form the material of the isolation structure 28.

By retaining the masking layer 26 within the trench 18 at the sidewalls 20 during the formation of the isolation structure 28, some benefits are realized. For example, process steps that would otherwise be required to remove the masking layer 26 are eliminated, thus saving processing time and processing costs. In addition, the masking layer 26 helps the nitridized silicon oxide precursor material layer 24 to retain those properties by which it inhibits the formation of silicon oxide from the sidewalls 20 of the trench 18. Further, the amorphous silicon of the masking layer 26 tends to preferentially react during the formation of the silicon oxide of the isolation structure 28, which further aids in reducing the reaction at the sidewalls 20 of the trench 18.

The isolation structure 28 is preferably formed in a thermal oxide process, where oxygen is introduced to the structures as described above at a flow rate of between about two standard liters per minute and about ten standard liters per minute, and most preferably about eight standard liters per minute, and at a temperature of between about 750 centigrade and about 1,150 centigrade, and most preferably about 1,050 centigrade. The process is allowed to continue for a length of time of between about five minutes and about one hundred and twenty minutes, and most preferably about sixty minutes. The process can be alternately conducted as either a wet oxidation or a dry oxidation.

Upon completion of the formation of the isolation structure 28, the isolation structure 28 appears substantially as depicted in FIG. 7. Although there are some similarities between the preferred method as described above and a LOCOS isolation process, the preferred method according to the present invention has some very unique process steps, as described above, and produces significantly different results. In particular, the isolation structure 28 produced according to the method as described above is relatively narrower and deeper than a standard LOCOS isolation structure. As depicted in FIG. 7, the isolation structure 28 grows preferentially from the exposed silicon substrate 10 at the bottom 22 of the trench 18, and thus the isolation structure 28 preferentially grows down, rather than across.

Thus, the isolation structure 28 deepens as it forms, but does not widen at the same rate at which it deepens. In the preferred embodiment the isolation structure 28 forms silicon oxide from the exposed silicon substrate 10 at the bottom 22 of the trench 18 at a rate that is at least about four times as fast as the oxidation rate of the silicon substrate 10 at the sidewalls 20 of the trench 18, which are protected by the precursor material layer 24 and perhaps also by the masking layer 26.

Thus, the nitrogen within the silicon oxide precursor material layer 24 acts as an agent to inhibit, at least in part, the formation of additional silicon oxide from the silicon substrate 10 at the sidewalls 20 of the trench 18. The isolation structure 28 is physically different from other isolation structures, not only because it is relatively narrower and deeper than other isolation structures, but also because the nitrogen rich silicon oxide of the precursor material layer 24 is retained within the isolation structure 28 near the sidewalls 20 of the silicon substrate 10. Subsequent processing of the integrated circuits to be formed on the semiconducting substrate 10 may then proceed as desired according to any one or more of a number of different processes.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a method of forming a narrow isolation structure in a semiconducting substrate, where a trench having a bottom and sidewalls is to be filled with an isolating material having desired electrical properties and desired chemical properties, where the isolating material is substantially reactively grown from the semiconducting substrate, the improvement comprising:

forming a precursor material layer on the bottom of the trench and on the sidewalls of the trench, where the precursor material layer has electrical properties and chemical properties that are substantially similar to the desired electrical properties and the desired chemical properties of the isolating material, where the precursor material is formed by, oxidizing the semiconducting substrate on the bottom of the trench and on the sidewalls of the trench to form an oxide layer on the semiconducting substrate, and exposing the oxide layer on the semiconducting substrate to a nitrogen plasma source to incorporate a quantity of nitrogen into the oxide layer to change the oxide layer into a nitridized oxide barrier layer adjacent the semiconducting substrate that at least partially inhibits formation of the isolating material from the semiconducting substrate, removing a substantial portion of the precursor material layer from the bottom of the trench to expose the semiconducting substrate at the bottom of the trench while leaving a substantial portion of the precursor material layer on the sidewalk of the trench, by, depositing a masking layer of amorphous silicon on top of the precursor material layer, removing the masking layer from the precursor material layer at the bottom of the trench, and etching the precursor material layer exposed by removing the masking layer at the bottom of the trench, and reactively growing the isolating material in the trench, where the isolating material preferentially grows from the exposed semiconducting substrate at the bottom of the trench at a first rate and the precursor material layer at least partially inhibits formation of the isolating material from the semiconducting substrate at the sidewalls of the trench, the isolating material forming from the sidewalls of the trench at a second rate, where the first rate is substantially higher than the second rate.

2. The method of claim 1, wherein the step of oxidizing the semiconducting substrate on the bottom of the trench and on the sidewalls of the trench comprises forming an oxide layer with a thickness of between about thirty angstroms and about five hundred angstroms.

3. The method of claim 1, wherein the semiconducting substrate is substantially monocrystalline silicon.

4. The method of claim 1, wherein the step of removing the masking layer comprises etching the masking layer with a highly anisotropic etch.

5. The method of claim 1, wherein the step of etching the precursor material layer comprises dry etching the precursor material layer.

6. The method of claim 1, wherein the step of etching the precursor material layer comprises wet etching the precursor material layer with an etchant that preferentially etches the precursor material layer at a first etch rate that is substantially greater than a second etch rate at which the etchant etches the masking layer.

7. The method of claim 1, wherein the step of reactively growing the isolating material in the trench comprises thermally growing an oxide from the semiconducting substrate.

8. The method of claim 1, wherein the first rate at which the isolating material grows from the exposed semiconducting substrate at the bottom of the trench is at least about four times as fast as the second rate at which the isolating material grows from the sidewalls of the trench.

9. In a method of forming a narrow local oxidation of silicon isolation structure in a silicon substrate, where a trench having a bottom and sidewalls is to be filled with an isolating silicon oxide material having desired electrical properties and desired chemical properties, and the isolating silicon oxide material is reactively grown from the silicon substrate, the improvement comprising:

forming a silicon oxide liner layer on the bottom of the trench and on the sidewalls of the trench, nitridizing the silicon oxide liner layer in a nitrogen plasma to form a nitridized silicon oxide liner layer adjacent the silicon substrate in the trench, depositing an amorphous silicon masking layer on top of the nitridized silicon oxide liner layer, etching the amorphous silicon masking layer in a highly anisotropic etch to substantially remove the amorphous silicon masking layer at the bottom of the trench while leaving a substantial portion of the amorphous silicon masking layer on the sidewalls of the trench, etching a substantial portion of the nitridized silicon oxide liner layer from the bottom of the trench to expose the silicon substrate at the bottom of the trench while leaving a substantial portion of the nitridized silicon oxide liner layer on the sidewalls of the trench, and reactively growing the isolating silicon oxide material in the trench, where the isolating silicon oxide material preferentially grows from the exposed silicon substrate at the bottom of the trench at a first rate and the nitridized silicon oxide liner layer at least partially inhibits formation of the isolating silicon oxide material from the sidewalls of the trench, the isolating silicon oxide material forming from the sidewalls of the trench at a second rate, where the first rate is substantially higher than the second rate.

10. The method of claim 9 wherein the step of forming a silicon oxide liner layer on the bottom of the trench and on the sidewalls of the trench comprises thermally growing the silicon oxide liner layer.

11. The method of claim 9, wherein the step of etching the amorphous silicon masking layer comprises etching the amorphous silicon masking layer with a highly directional ion etch.

12. The method of claim 9, wherein the step of etching a substantial portion of the silicon oxide liner layer from the bottom of the trench to expose the silicon substrate at the bottom of the trench comprises wet etching the silicon oxide liner layer.

* * * * *